United States Patent
Larsson et al.

(10) Patent No.: US 11,591,689 B2
(45) Date of Patent: *Feb. 28, 2023

(54) METHOD FOR FABRICATING CHAMBER PARTS

(71) Applicant: Applied Materials, Inc., Santa Clara, CA (US)

(72) Inventors: Mats Larsson, Sunnyvale, CA (US); Kevin A. Papke, Portland, OR (US); Chirag Shaileshbhai Khairnar, Gujarat (IN); Rajasekhar Patibandla, Bangalore (IN); Karthikeyan Balaraman, Bangalore (IN); Balamurugan Ramasamy, Bangalore (IN); Kartik Shah, Saratoga, CA (US); Umesh M. Kelkar, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/791,264

(22) Filed: Feb. 14, 2020

(65) Prior Publication Data
US 2020/0270747 A1  Aug. 27, 2020

Related U.S. Application Data

(60) Provisional application No. 62/810,122, filed on Feb. 25, 2019.

(51) Int. Cl.
C23C 16/02 (2006.01)
C23C 16/40 (2006.01)
(Continued)

(52) U.S. Cl.
CPC .......... C23C 16/0281 (2013.01); C04B 35/01 (2013.01); C04B 35/04 (2013.01);
(Continued)

(58) Field of Classification Search
CPC .................................................. C23C 16/4404
See application file for complete search history.

(56) References Cited

U.S. PATENT DOCUMENTS 9,384,950 B2 * 7/2016 Duan .................. C09D 7/61
10,276,353 B2 * 4/2019 Alayavalli .......... C23C 16/4404
(Continued)

FOREIGN PATENT DOCUMENTS

| WO | 2017155711 A1 | 9/2017 |
| WO | 2020009766 A1 | 1/2020 |
| WO | 2020013918 A1 | 1/2020 |

*Primary Examiner* — Mark Ruthkosky
*Assistant Examiner* — Julia L Rummel
(74) *Attorney, Agent, or Firm* — Patterson + Sheridan, LLP

(57) ABSTRACT

One embodiment of the disclosure provides a method of fabricating a chamber component with a coating layer disposed on an interface layer with desired film properties. In one embodiment, a method of fabricating a coating material includes providing a base structure comprising an aluminum or silicon containing material, forming an interface layer on the base structure, wherein the interface layer comprises one or more elements from at least one of Ta, Al, Si, Mg, Y, or combinations thereof, and forming a coating layer on the interface layer, wherein the coating layer has a molecular structure of $Si_vY_wMg_xAl_yO_z$. In another embodiment, a chamber component includes an interface layer disposed on a base structure, wherein the interface layer is selected from at least one of Ta, Al, Si, Mg, Y, or combinations thereof, and a coating layer disposed on the interface layer, wherein the coating layer has a molecular structure of $Si_vY_wMg_xAl_yO_z$.

9 Claims, 3 Drawing Sheets

(51) Int. Cl.
| | |
|---|---|
| C23C 16/56 | (2006.01) |
| C23C 16/513 | (2006.01) |
| C23C 16/44 | (2006.01) |
| C04B 35/18 | (2006.01) |
| C04B 35/44 | (2006.01) |
| C04B 35/10 | (2006.01) |
| C04B 35/20 | (2006.01) |
| C04B 35/505 | (2006.01) |
| C04B 35/14 | (2006.01) |
| C04B 35/04 | (2006.01) |
| C04B 35/16 | (2006.01) |
| C04B 35/01 | (2006.01) |
| C04B 35/195 | (2006.01) |

(52) U.S. Cl.
CPC .............. *C04B 35/10* (2013.01); *C04B 35/14* (2013.01); *C04B 35/16* (2013.01); *C04B 35/18* (2013.01); *C04B 35/195* (2013.01); *C04B 35/20* (2013.01); *C04B 35/44* (2013.01); *C04B 35/505* (2013.01); *C23C 16/405* (2013.01); *C23C 16/4404* (2013.01); *C23C 16/513* (2013.01); *C23C 16/56* (2013.01); *C04B 2235/96* (2013.01); *Y10S 156/914* (2013.01); *Y10T 428/1259* (2015.01); *Y10T 428/1266* (2015.01); *Y10T 428/12597* (2015.01); *Y10T 428/12604* (2015.01); *Y10T 428/12611* (2015.01); *Y10T 428/12667* (2015.01); *Y10T 428/12736* (2015.01); *Y10T 428/12743* (2015.01); *Y10T 428/12764* (2015.01); *Y10T 428/1317* (2015.01); *Y10T 428/31504* (2015.04); *Y10T 428/31678* (2015.04)

(56) References Cited

U.S. PATENT DOCUMENTS

| | | | |
|---|---|---|---|
| 2006/0165994 A1* | 7/2006 | Dalakos | C04B 41/009 428/408 |
| 2007/0138601 A1* | 6/2007 | Fan | H01L 21/67103 257/632 |
| 2015/0221480 A1* | 8/2015 | Duan | C09D 7/61 106/286.5 |
| 2018/0105701 A1 | 4/2018 | Larsson et al. | |
| 2020/0020511 A1 | 1/2020 | Balaraman et al. | |

* cited by examiner

METHOD FOR FABRICATING CHAMBER PARTS

CROSS-REFERENCE TO RELATED APPLICATIONS

This application claims benefit of U.S. Provisional Application Ser. No. 62/810,122, filed Feb. 25, 2019, the contents of which are incorporated herein by reference in its entirety.

BACKGROUND

Field

Embodiments of the present disclosure generally relate to a method and apparatus for plasma processing and, more specifically, to a method and apparatus for plasma processing with component parts with enhanced film properties.

Description of the Related Art

The fabrication of microelectronics or integrated circuit devices typically involves a complicated process sequence requiring hundreds of individual steps performed on semiconductors, dielectric and conductive substrates. Examples of these process steps include oxidation, diffusion, ion implantation, thin film deposition, cleaning, etching and lithography. Plasma processes are often used for thin film deposition and etching, which are performed in a plasma chamber. In chemical vapor deposition, reactive species are generated by applying voltages to suitable process gases, and subsequent chemical reactions result in the formation of a thin film on a substrate. In plasma etching, a previously deposited film is exposed to the reactive species in a plasma, often through a patterned mask layer formed in a prior lithography step. Reactions between the reactive species and the deposited film result in the removal, or etching, of the deposited film.

When chamber parts or process kits are exposed to the plasma environment for extended periods, deterioration may occur due to reaction with the plasma species. For example, existing process kits or component parts of a plasma chamber are often made of aluminum containing materials (such as aluminum oxide, aluminum oxynitride or aluminum nitride). Halogen-containing gases, e.g., fluorine- or chlorine-containing gases, are used in etching various material layers in circuit fabrication. It is believed that aluminum containing materials is vulnerable to attack by fluorine species, resulting in the formation of $Al_xF_yO_z$ or $Al_xF_yN_z$ on the surface of component parts. Such etch by-product may come off as particles during processing, resulting in contamination and defects on the substrate during processing.

Thus, there is a need for a chamber part that has a reliable surface material for plasma applications without deteriorating over time, and for improved processes for fabricating such materials with a proper coating.

SUMMARY

One embodiment of the disclosure provides a method of fabricating a chamber component with a coating layer disposed on an interface layer with desired film properties. In one embodiment, a method of fabricating a coating material includes providing a base structure comprising an aluminum or silicon containing material, forming an interface layer on the base structure, wherein the interface layer includes one or more elements from at least one of Ta, Al, Si, Mg, Y, or combinations thereof, and forming the coating layer on the interface layer, wherein the coating layer has a molecular structure of $Si_vY_wMg_xAl_yO_z$.

In another embodiment, a method of fabricating a coating material includes providing a base structure comprising an aluminum or silicon containing material, forming an interface layer on the base structure, forming a coating layer on the interface layer, wherein the coating layer has a molecular structure of $Si_vY_wMg_xAl_yO_z$, wherein the interface layer and the coating layer share a common element, and thermally treating the coating layer and the interface layer formed on the base structure.

In yet another embodiment, a chamber component includes an interface layer disposed on a base structure, wherein the interface layer is selected from at least one of Ta, Al, Si, Mg, Y, or combinations thereof, and a coating layer disposed on the interface layer, wherein the coating layer has a molecular structure of $Si_vY_wMg_xAl_yO_z$.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Certain embodiments of the present disclosure provide a method and an apparatus for fabricating parts with a coating with improved characteristics such as enhanced chemical or plasma resistance. In one embodiment, an interface layer is disposed between a coating layer and a part to enhance the adhesion therebetween. The coating layer along with the interface layer provides a film stack with enhanced film characteristics. In one example, the interface layer formed between the coating layer and the part may share at least one element from the coating layer so as to provide strong interface adhesion with minimum defects (e.g., voids, cracks, or interface feeling).

Figure 1:
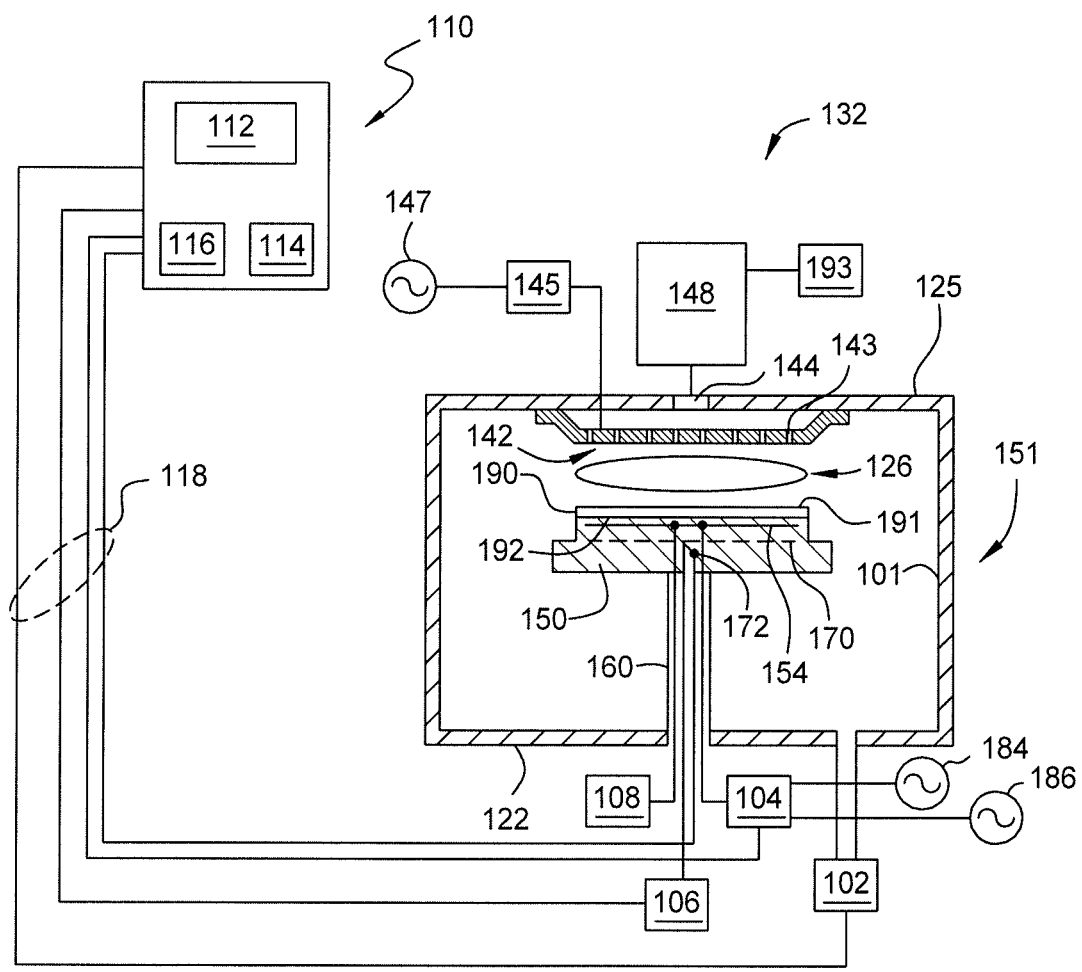
FIG. 1 is a schematic diagram of a plasma reactor having at least one chamber component having a coating layer formed therein.

FIG. 1 is a cross sectional view of a plasma processing chamber 132 suitable for performing a plasma deposition process (e.g., a plasma enhanced CVD or a metal organic CVD) where a part (e.g., a chamber component) may be utilized therein. The surfaces of these chamber components that may benefit from the interface and the coating layer described below.

The plasma processing chamber 132 includes a chamber body 151. The chamber body 151 includes a lid 125, a sidewall 101 and a bottom wall 122 that define an interior volume 126.

A substrate support pedestal 150 is provided in the interior volume 126 of the chamber body 151. The substrate support pedestal 150 may be fabricated from aluminum, ceramic, aluminum nitride, and other suitable materials. In one embodiment, the substrate support pedestal 150 is fabricated by a ceramic material, such as aluminum nitride, which is a material suitable for use in a high temperature environment, such as a plasma process environment, without causing thermal damage to the substrate support pedestal 150. The substrate support pedestal 150 may be moved in a vertical direction inside the chamber body 151 using a lift mechanism (not shown).

The substrate support pedestal 150 may include an embedded heater element 170 suitable for controlling the temperature of a substrate 190 supported on the substrate support pedestal 150. In one embodiment, the substrate support pedestal 150 may be resistively heated by applying an electric current from a power supply 106 to the heater element 170. In one embodiment, the heater element 170 may be made of a nickel-chromium wire encapsulated in a nickel-iron-chromium alloy (e.g., INCOLOY®) sheath tube. The electric current supplied from the power supply 106 is regulated by a controller 110 to control the heat generated by the heater element 170, thus maintaining the substrate 190 and the substrate support pedestal 150 at a substantially constant temperature during film deposition at any suitable temperature range. In another embodiment, the pedestal may be maintained at room temperature as needed. In yet another embodiment, the substrate support pedestal 150 may also include a chiller (not shown) as needed to cool the substrate support pedestal 150 at a range lower than room temperature as needed. The supplied electric current may be adjusted to selectively control the temperature of the substrate support pedestal 150 between about 100 degrees Celsius to about 700 degrees Celsius.

A temperature sensor 172, such as a thermocouple, may be embedded in the substrate support pedestal 150 to monitor the temperature of the substrate support pedestal 150 in a conventional manner. The measured temperature is used by the controller 110 to control the power supplied to the heater element 170 to maintain the substrate at a desired temperature.

The substrate support pedestal 150 generally includes a plurality of lift pins (not shown) disposed therethrough that are configured to lift the substrate 190 from the substrate support pedestal 150 and facilitate exchange of the substrate 190 with a robot (not shown) in a conventional manner.

The substrate support pedestal 150 includes at least one electrode 154 for retaining the substrate 190 on the substrate support pedestal 150. The substrate support pedestal 150 is supported by a shaft 160. The shaft 160 has a hollow center through which wiring is passed. The wiring couples circuits to the electrode 154 and heater element(s) 170 disposed within the substrate support pedestal 150. The electrode 154 is driven by a chucking power source 108 to develop an electrostatic force that holds the substrate 190 to a pedestal surface 192, as is conventionally known. Alternatively, the substrate 190 may be retained to the substrate support pedestal 150 by clamping, vacuum or gravity.

In one embodiment, the substrate support pedestal 150 is configured as a cathode having the electrode 154 embedded therein coupled to at least one RF bias power source, shown in FIG. 1 as two RF bias power sources 184, 186. Although the example depicted in FIG. 1 shows two RF bias power sources, 184, 186, it is noted that the number of the RF bias power sources may be any number as needed. The RE bias power sources 184, 186 are coupled between the electrode 154 disposed in the substrate support pedestal 150 and another electrode, such as a gas distribution plate 142 or lid 125 of the plasma processing chamber 132. The RF bias power source 184, 186 excites and sustains a plasma discharge formed from the gases disposed in the processing region of the plasma processing chamber 132.

In the embodiment depicted in FIG. 1, the dual RF bias power sources 184, 186 are coupled to the electrode 154 disposed in the substrate support pedestal 150 through a matching circuit 104. Additionally, the chucking power source 108 and the matching circuit 104 are coupled to the electrode 154. The signal generated by the RF bias power source 184, 186 is delivered through matching circuit 104 to the substrate support pedestal 150 through a single feed to ionize the gas mixture provided in the plasma processing chamber 132, providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts.

A vacuum pump 102 is coupled to a port formed in the bottom wall 122 of the chamber body 151. The vacuum pump 102 is used to maintain a desired gas pressure in the chamber body 151. The vacuum pump 102 also evacuates post-processing gases and by-products of the process from the chamber body 151.

The plasma processing chamber 132 includes one or more gas delivery passages 144 coupled through the lid 125 of the plasma processing chamber 132. The gas delivery passages 144 and the vacuum pump 102 are positioned at opposite ends of the plasma processing chamber 132 to induce laminar flow within the interior volume 126 to minimize particulate contamination.

The gas delivery passage 144 is coupled to the gas panel 193 through a remote plasma source (RPS) 148 to provide a gas mixture into the interior volume 126. In one embodiment, the gas mixture supplied through the gas delivery passage 144 may be further delivered through a gas distribution plate 142 disposed below the gas delivery passage 144. In one example, the gas distribution plate 142 having a plurality of apertures 143 is coupled to the lid 125 of the chamber body 151 above the substrate support pedestal 150. The apertures 143 of the gas distribution plate 142 are utilized to introduce process gases from the gas panel 193 into the chamber body 151. The apertures 143 may have different sizes, number, distributions, shape, design, and diameters to facilitate the flow of the various process gases for different process requirements. A plasma is formed from the process gas mixture exiting the gas distribution plate 142 to enhance thermal decomposition of the process gases resulting in the deposition of material on the surface 191 of the substrate 190.

The gas distribution plate 142 and substrate support pedestal 150 may be formed a pair of spaced apart electrodes in the interior volume 126. One or more RF sources 147 provide a bias potential through a matching network 145 to the gas distribution plate 142 to facilitate generation of a plasma between the gas distribution plate 142 and the substrate support pedestal 150. Alternatively, the RF sources 147 and matching network 145 may be coupled to the gas distribution plate 142, substrate support pedestal 150, or coupled to both the gas distribution plate 142 and the substrate support pedestal 150, or coupled to an antenna (not shown) disposed exterior to the chamber body 151. In one embodiment, the RF sources 147 may provide between about 10 Watts and about 3000 Watts at a frequency of about 30 kHz to about 13.6 MHz. Alternatively, the RF source 147 may be a microwave generator that provide microwave power to the gas distribution plate 142 that assists generation of the plasma in the interior volume 126.

Examples of gases that may be supplied from the gas panel 193 may include a silicon containing gas, fluorine continuing gas, oxygen containing gas, hydrogen containing gas inert gas and carrier gases. Suitable examples of the reacting gases includes a silicon containing gas, such as $SiH_4$, $Si_2H_6$, $SiF_4$, $SiH_2Cl_2$, $Si_4H_{10}$, $Si_5H_{12}$, TEOS and the like. Suitable carrier gas includes nitrogen ($N_2$), argon (Ar), hydrogen ($H_2$), alkanes, alkenes, helium (He), oxygen ($O_2$), ozone ($O_3$), water vapor ($H_2O$), and the like.

In one embodiment, the remote plasma source (RPS) 148 may be alternatively coupled to the gas delivery passages 144 to assist in forming a plasma from the gases supplied from the gas panel 193 into the in the interior volume 126. The remote plasma source 148 provides plasma formed from the gas mixture provided by the gas panel 193 to the plasma processing chamber 132.

The controller 110 includes a central processing unit (CPU) 112, a memory 116, and a support circuit 114 utilized to control the process sequence and regulate the gas flows from the gas panel 193. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the plasma processing chamber 132 are handled through numerous signal cables collectively referred to as signal buses 118, some of which are illustrated in FIG. 1.

It is noted that all of the above described chamber component, such as the gas distribution plate 142, or substrate support pedestal 150, may have a coating layer along with the interface layer fabricated by the method described below to enhance the surface protection and chemical/plasma resistance.

Figure 2:
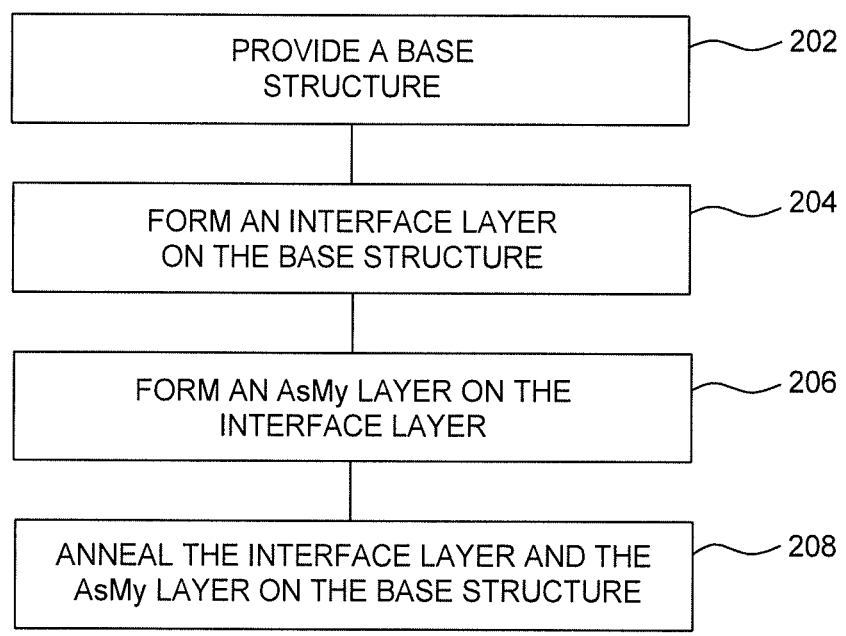
FIG. 2 is a method for manufacturing a coating layer on a chamber component of FIG. 1.
Figure 3A:
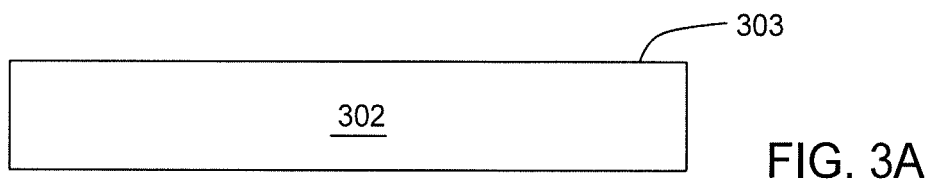
FIGS. 3A-3C are schematic illustrations of cross sectional views of the coating layer formed on the chamber component.

FIG. 2 illustrates one embodiment of a method 200 that can be used to fabricate an interface layer and a coating layer 306 disposed on the interface layer on a base structure, such as a part or a chamber component. The base structure comprising an aluminum or silicon containing material is provided. The method 200 starts at operation 202 by providing a base structure, such as the base structure 302 depicted in FIG. 3A, into a coating deposition chamber. In one embodiment, the base structure 302 may be a metal dielectric material, such as $Al_2O_3$, AlN, AlON, bulk yttrium, suitable rare earth containing materials and the like. In one example, the base structure 302 is made from AlN that allows a coating structure to be formed thereon.

Figure 3B:
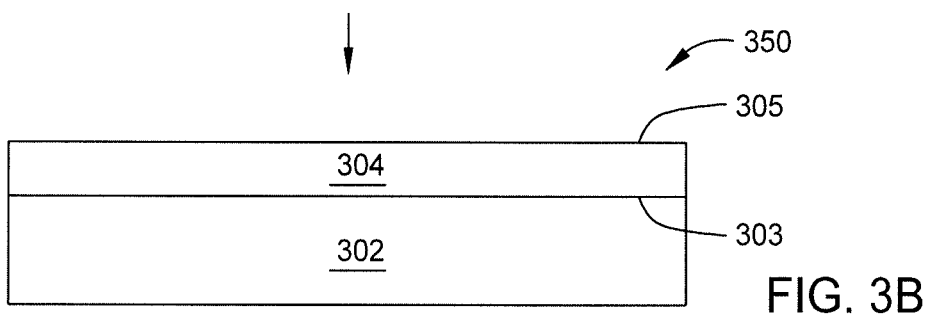
Figure 3C:
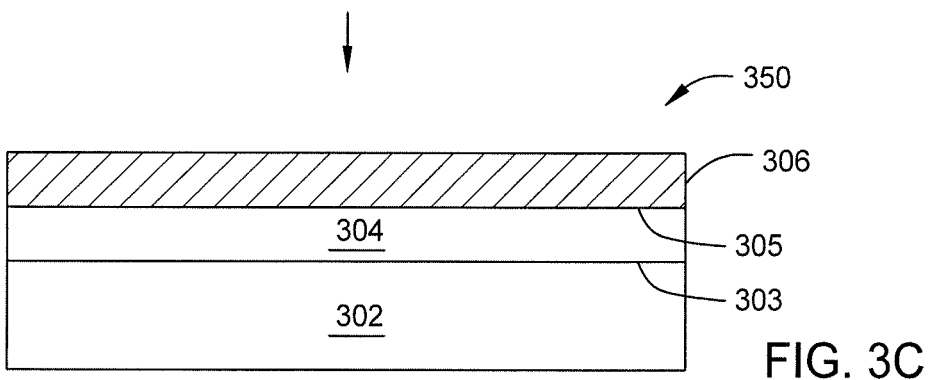

At operation 204, a coating deposition process is performed to form an interface layer 304 on a surface 303 of the base structure 302, as shown in FIG. 3B. After the interface layer 304 is formed, the coating layer 306 is formed on a surface 305 of the interface layer 304. The interface layer 304 may provide good interface control between the base structure 302 and the coating layer 306, which will be later formed on the interface layer 304, as shown in FIG. 3C. The proper interface management provided by the interface layer 304 may efficiently enhance the adhesion between the base structure 302 and the coating layer 306, reducing likelihood of particle generation or film peeling during a plasma process, thus promoting the interface bonding with good chamber part quality control.

It is noted that the interface layer 304 may be formed by any suitable coating deposition process, such as a PVD process, a CVD process, an ALD process, a liquid spray coating, gel spraying coating, plasma spray coating or other suitable deposition coating chambers as needed.

In one example, the interface layer 304 may be a metal containing material, a dielectric layer, or a rare earth dielectric layer. Suitable examples of the metal containing material include Ta, Ti, TaN, TiN, TaON, TaO, TiON, TiO, MgO, $Al_2O_3$, AlN, AlON, and other suitable metal containing oxide or metal containing nitrides. Suitable examples of the dielectric layer include $SiO_2$, SiON, SiN, SiC, or the like. Suitable examples of the rare earth dielectric layer include yttrium containing material, such as yttria (yttrium oxide, $Y_2O_3$). In one example, the interface layer 304 includes one or more elements from at least one of Ta, Al, Si, Mg, Y, combinations thereof, and the like.

The interface layer 304 may be formed under any suitable temperature range regulated under different deposition techniques, such as from room temperature up to 600 degrees Celsius as needed. In one example wherein the interface layer 304 is a metal containing material, such as a Ta material, the interface layer 304 may be formed by a PVD process, either under room temperature or under an elevated temperature range from 200 degrees Celsius and about 550 degrees Celsius. In another example wherein the interface layer 304 is a dielectric layer, such as a $SiO_2$, SiON, SiN, or SiC layer, the interface layer 304 may be formed by a CVD or an ALD process, either under room temperature or under an elevated temperature range from 200 degrees Celsius and about 550 degrees Celsius. In yet another example wherein the interface layer 304 is a rare earth dielectric layer, such as bulk yttria or yttrium oxide ($Y_2O_3$), the interface layer 304 may be formed by a PVD, CVD, an ALD process or a plasma spray coating process, either under room temperature or under an elevated temperature range from 200 degrees Celsius and about 550 degrees Celsius.

In one embodiment, the elements from the interface layer 304 may not only provide a strong bonding with the base structure 302, but also bond with the elements from the upcoming coating layer 306, which will be subsequently formed thereon. Thus, the selection of the interface layer 304 may have similar (or at least share one common element from the base structure 302 or the coating layer 306) film properties (e.g., compatible film characteristics) at the interface to improve surface adhesion and eliminate the likelihood of film peeling that may be caused by poor adhesion and/or incompatible film properties. Furthermore, the elements formed in the interface layer 304 may efficiently bridge with the base structure 302 and/or with the upcoming coating layer 306, thus providing a good surface adhesion at the interfaces.

In one example, the interface layer 304 and the base structure 302 and/or the coating layer 306 share a common element. In one embodiment, the common element is at least one of Ta, Si, Al, Mg, Y, or a combination thereof. In an embodiment, the interface layer 304 and the base structure 302 share common aluminum or silicon elements. In another embodiment, the interface layer 304 and the coating layer 306 share common tantalum, silicon, yttria, or magnesium elements. In one example, the interface layer 304 may have a thickness between about 100 nm and about 100 µm.

In one example, the interface layer 304 has a film stress ranging from a slight tensile stress to a compressive stress. Different deposition techniques may result in the interface layer 304 with different stress range. In one example, the interface layer 304 may have a compressive (or compressive to tensile) film stress between −1000 mega-pascal (MPa) and 100 mega-pascal (MPa).

At operation 206, after the interface layer 304 is formed, the coating layer 306 is then formed on the interface layer 304. The coating layer 306 has a molecular structure comprising aluminum oxide, silicon, magnesium and yttrium (called an AsMy layer). In one example, the coating layer 306 has a molecular structure that includes $Si_vY_wMg_xAl_yO_z$. The coating layer 306 provides a relatively chemical inert and/or high plasma resistance (e.g., against hydrogen radicals or halogen radicals) during a plasma process when implementing on a chamber part disposed in a plasma processing chamber. In one example wherein the molecular structure of $Si_vY_wMg_xAl_yO_z$ of the coating layer 306 is utilized, v ranges from about 0.0196 to 0.2951; w ranges from about 0.0131 to 0.1569; x ranges from about 0.0164 to 0.0784; y ranges from about 0.0197 to 0.1569; and z ranges from about 0.5882 to 0.6557, wherein v+w+x+y+z=1 (excluding impurities). As discussed, the coating layer 306 is formed on the surfaces exposed to a plasma, radicals, or both during the operation of the chamber. The coating layer 306 of $Si_vY_wMg_xAl_yO_z$ composition on processing chamber surfaces may substantially reduce, if not eliminate, the decrease of chamber performance over time with an enhanced adhesion attached to the chamber surfaces with the assistance of the interface layer 304.

Surfaces of the chamber components (e.g., the base structure 302) often in direct contact and/or under exposure to plasma and/or aggressive radicals. Thus, a robust surface finish is desired to protect the chamber components from being consumed by the hydrogen and/or halogen radicals generated in a plasma process. Without the coating layer 306 with the strong bonding to the base structure 302 assisted by the interface layer 304, the base structure 302 composed of silica or aluminum are often attacked by the hydrogen and/or halogen radicals, thus reducing process efficiency as well as generating process byproducts. For example, aluminum surfaces from the base structure 302 may be transformed into aluminum fluoride or aluminum hydride after the plasma process. As total chamber run time increases, the surface layer of aluminum fluoride grows thicker, resulting in particle generation that pollutes and contaminates the substrate processed in the processing chamber.

The coating layer 306 (e.g., an AsMy layer) formed on the interface layer 304 can provide a relatively chemical inert and/or high plasma resistance that would consume substantially fewer, if any, hydrogen/halogen radicals as compared to conventional surfaces. Accordingly, coating the surfaces of chamber components that are exposed to plasma and/or radicals, such as hydrogen and/or halogen radicals, with the coating layer 306 improves chamber performance and enables the formation of high quality films formed on the substrate disposed in the processing chamber during a plasma process. The coating layer 306 along with strong interface control provided by the interface layer 304 on processing chamber surfaces may substantially reduce, if not eliminate, the decrease of chamber performance over time.

Additionally, coating chamber surfaces with the coating layer 306 and the interface layer 304 improves the plasma erosion resistance of the inner surfaces of the processing chamber.

In one embodiment, the coating layer 306 may be formed by providing raw powders of $Al_2O_3$ $SiO_2$, MgO, and $Y_2O_3$ thoroughly mixed together using a ball milling process. The raw powders have a purity of at least 98%, or greater, for example, a purity of about 99.9%. Size of the raw powders may be between about 10 nanometers (nm) to about 100 microns (µm), such as about 5 µm to about 15 µm, for example about 10 µm. The weight ratio of the water:powder:ball may be about 1:1:2. The mixtures of $Al_2O_3$ $SiO_2$, MgO, and $Y_2O_3$ may have the following proportions, in terms of molar percent: $SiO_2$: 10-90%; $Y_2O_3$: 2-50%; MgO: 5-40%; and $Al_2O_3$: 3-40%. For instance, the proportions may be, in terms of molar percent: $SiO_2$: 20-60%; $Y_2O_3$: 8-25%; MgO: 12-25%; and $Al_2O_3$: 10-35%. In a specific example, the mixing proportions may be 56.8 molar % $SiO_2$; 10.2 molar % $Y_2O_3$, 18 molar % MgO; and 15.0 molar % $Al_2O_3$. In another representative example, the mixing proportions may be 90.0 molar % $SiO_2$, 2.0 molar % $Y_2O_3$, 5.0 molar % MgO, and 3.0 molar % $Al_2O_3$. In another embodiment, the mixing proportions may be 10% $SiO_2$, 50% $Y_2O_3$, 20% MgO, and 20% $Al_2O_3$. After the raw powders are thoroughly mixed, the mixture may be melted at a temperature ranging from about 1400° C. to about 1800° C. for about 120 minutes. The melted mixture of raw powders may then be quenched to air/water form an AsMy glass.

The AsMy glass may then be crushed into small particles. The small particles may range in size from about 100 nm to about 10 µm. The crushed AsMy may then be mixed with a binder. The binder may be, for example, polyvinyl alcohol (PVA). The binder is then dissolved into deionized water to make a solution. In one example, the mass ratio of binder to water is 3:97. The crushed AsMy to solution ratio may be from about 20:100 to about 45:100, such as 30:100. After the solution and the AsMy glass powders are mixed together, the mixture is spray dried to generate granular particles. The granular particles may range in size from about 20-50 µm. In one embodiment, the D 50 particle size distribution (i.e., the median value of particle diameter at 50% in the cumulative distribution) is about 30 µm.

In another embodiment, the AsMy layer is prepared according to a melting and quenching process. Raw powders of $Al_2O_3$ $SiO_2$, MgO, and $Y_2O_3$ are thoroughly mixed and placed in a quartz crucible. The mixed powders are heated to about 1,500 degrees Celsius. The crucible may be heated using a heater or plasma may be used to heat the powders. The melt is then quenched to provide pieces which are ball milled to make granular particles. The particles are then spray dried (with or without a binder). In one embodiment, the D 50 particle size distribution of the granular particles is about 30 µm.

In the embodiments above, substantially round particles are produced. However, in another embodiment, non-symmetrical or irregular particles may be produced. Producing the irregular particles is similar to the process above with the exception of screening the particles after ball milling, and the spray drying process is omitted. After milling, the particles may be screened. In one embodiment, the D 50 particle size distribution of the irregular particles is about 30 µm. In another embodiment, the D 50 particle size distribution of the irregular particles is about 45 µm.

The particles may be applied to a processing chamber component by a thermal spraying process, such as by a plasma spraying process. The coating layer 306 may be glass (amorphous solid) or glass-ceramic (a material having an amorphous phase and one or more crystalline phases). To get a glass AsMy coating, component temperature may be less than 150° C., and/or the working distance between the component and the plasma gun will be greater than when making a glass-ceramic coating. To get a glass-ceramic AsMy coating, component temperature may be greater than 400° C. and/or the working distance between the component and plasma gun may be at lesser distance than when making a glass coating.

During the plasma spraying process, the component temperature may be maintained at approximately 150° C. for amorphous AsMy coatings and approximately 450° C. for glass-ceramic coatings on ceramic components. The AsMy coating may be applied until it has a thickness of about 20-300 um, such as 100-250 um, for example 200 urn. The coating layer 306 may be applied directly to the interface layer 304 disposed on the base structure 302 (e.g., a processing chamber component), such as a coating deposited on a surface of the processing chamber component. The surface roughness of the coating layer 306 may be between about 1 μm and about 10 μm.

The final coatings may include the following molecular structure, $Si_vY_wMg_xAl_yO_z$, wherein v ranges from about 0.0196 to about 0.2951, w ranges from about 0.0131 to about 0.1569, x ranges from about 0.0164 to about 0.0784, y ranges from about 0.0197 to about 0.1569, and z ranges from about 0.5882 to about 0.6557. For example, v may range from about 0.0393 to about 0.118; w may range from about 0.0213 to about 0.0634; x may range from about 0.0119 to about 0.0356; y may range from about 0.0221 to about 0.0663; and z may range from about 0.155 to about 0.466. For example, the molecular structure may be $Si_{0.171}Y_{0.062}Mg_{0.054}Al_{0.090}O_{0.623}$ or approximately $Si_{0.171}Y_{0.062}Mg_{0.054}Al_{0.090}O_{0.623}$. In another embodiment, the molecular structure may be approximately $Si_4Y_2Mg_2Al_3O_{14}$.

It is noted that the base structure 302 described herein may be used for any suitable processing chamber components including the walls of the chamber, any components contained within the processing chamber, such as, for example a showerhead, a baffle, a blocker plate, and a substrate support, and any components coupled to the chamber, such as, for example, a remote plasma source system, a gas delivery system, and a vacuum system. Representative processing surfaces that may benefit from the coating layer 306 along with the interface layer 304 are illustrated in relation to FIG. 1.

In one embodiment, the coating layer 306 has a pore density less than 5%. Similarly, the coating layer 306 has a film stress ranging from a tensile stress a compressive stress. Different deposition techniques may result in the coating layer 306 with different stress range. In one example, the coating layer 306 may have a film stress between −700 mega-pascal (MPa) and 1000 mega-pascal (MPa).

In one example, the coating layer 306 may have a film stress between −700 mega-pascal (MPa) and 1000 mega-pascal (MPa) and interface layer 304 may have a film stress between −700 mega-pascal (MPa) and −900 mega-pascal (MPa) when the interface layer 304 includes a Ta containing material.

In another example, the coating layer 306 may have a film stress between −700 mega-pascal (MPa) and 200 mega-pascal (MPa) and interface layer 304 may have a film stress between −140 mega-pascal (MPa) and −160 mega-pascal (MPa) when the interface layer 304 includes a silicon oxide ($SiO_2$) containing material.

In yet another example, the coating layer 306 may have a film stress between −700 mega-pascal (MPa) and 200 mega-pascal (MPa) and interface layer 304 may have a film stress between −100 mega-pascal (MPa) and −120 mega-pascal (MPa) when the interface layer 304 includes an yttria ($Y_2O_3$) containing material.

In still another example, the film stack including the interface layer 304 and the coating layer 306 may in combination has a film stress between about −700 mega-pascal (MPa) and 300 mega-pascal (MPa), such as between about −700 mega-pascal (MPa) and −300 mega-pascal (MPa).

At operation 208, a thermal/annealing process is performed to promote the interface bonding between the coating layer 306 and the interface layer 304. The thermal/annealing process may maintain the base structure 302 temperature at above 300 degrees Celsius, such as between about 400 degrees Celsius and about 800 degrees Celsius, for example between about 450 degrees Celsius and about 600 degrees Celsius. The thermal/annealing process may be performed in a thermal processing chamber, such as a RTP chamber or any suitable heating processing chamber. The thermal processing chamber may be a processing chamber described with a heating module, such as a lamp or heating assembly formed therein to provide a thermal energy source. While performing the thermal/annealing process, a carrier gas may or may not be supplied during the heat/thermal process. The carrier gas may be selected from a group consisting of $N_2$, $O_2$, $H_2$, inert gas, or any suitable gases as needed.

The thermal/annealing process is performed to repair, densify and enhance lattice structures of the coating layer 306 and the interface layer 304 in combination bonded to the base structure 302. For example, after the thermal/annealing process, the interface bonding energy, such as between the coating layer 306 and the interface layer 304 and between the interface layer 304 and the base structure 302, may be further enhanced so that the coating layer 306 would not be easily peeled off under the attach from the hydrogen/halogen radicals during a plasma process.

As the coating layer 306 along with the interface layer 304 formed on the base structure 302 has a relatively robust structure and interface bonding structure, upon coating the coating layer 306 and the interface layer 304 on the chamber component in a processing chamber, such as the plasma processing chamber 132 in FIG. 1, the coating layer 306 may maintain a good surface condition while undergoing the attack of the aggressive plasma species during a plasma process. Thus, the likelihood of generating particles or contamination from a chamber wall, a substrate support, a gas distribution plate or other chamber components from the processing chamber is reduced.

Furthermore, after the annealing process, the film stack including the interface layer 304 and the coating layer 306 may in combination has a film stress between about −300 mega-pascal (MPa) and −700 mega-pascal (MPa).

Embodiments of this disclosure can be used to fabricate the coating layer 306 (e.g., an AsMy layer) with the assistance of an interface layer on a chamber part for a variety of applications. These enhanced surface coating chamber parts are suitable for use in corrosive environments such as those encountered in plasma processes. A variety of plasma deposition and etch chambers may benefit from the teachings disclosed herein. It is contemplated that other suitable plasma reactors, including those from other process types, may be adapted to benefit from the disclosure.

While the foregoing is directed to embodiments of the present disclosure, other and further embodiments of the disclosure may be devised without departing from the basic scope thereof, and the scope thereof is determined by the claims that follow.

The invention claimed is:

1. A chamber component for a plasma processing chamber comprising:
   an interface layer disposed on a base structure, wherein the interface layer comprises Ta and, optionally, one or more of Al, Si, Mg, and Y and has a film stress between −700 MPa and −900 MPa; and
   a coating layer disposed on the interface layer, wherein the coating layer has a molecular structure of $Si_vY_wMg_xAl_yO_z$ and each of v, w, x, y, and z represents a non-zero value,
   wherein a film stress of the coating layer is between about −700 MPa and about 1000 MPa.

2. The chamber component of claim 1, wherein the interface layer and the coating layer share a common element.

3. The chamber component of claim 1, wherein the interface layer and the base structure share a common element.

4. The chamber component of claim 1, wherein the base structure is an aluminum or silicon containing material.

5. The chamber component of claim 1, wherein the coating layer is a compressive or a tensile film.

6. The chamber component of claim 1, wherein the coating layer has a film stress between about −700 MPa and about 1000 MPa.

7. The chamber component of claim 1, wherein the interface layer is formed at a component temperature from about 200 degrees Celsius to about 550 degrees Celsius.

8. The chamber component of claim 1, wherein the molecular structure of the coating layer is $Si_vY_wMg_xAl_yO_z$, and wherein v is from about 0.0196 to 0.2951.

9. The chamber component of claim 8, wherein the molecular structure of the coating layer is $Si_vY_wMg_xAl_yO_z$, and wherein w is from about 0.0131 to 0.1569.

* * * * *